United States Patent
Lahoda

(10) Patent No.: US 11,404,175 B2
(45) Date of Patent: Aug. 2, 2022

(54) SILICON CARBIDE REINFORCED ZIRCONIUM BASED CLADDING

(71) Applicant: WESTINGHOUSE ELECTRIC COMPANY LLC, Cranberry Township, PA (US)

(72) Inventor: Edward J. Lahoda, Edgewood, PA (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 169 days.

(21) Appl. No.: 16/502,235

(22) Filed: Jul. 3, 2019

(65) Prior Publication Data
US 2020/0020455 A1 Jan. 16, 2020

Related U.S. Application Data

(60) Provisional application No. 62/698,326, filed on Jul. 16, 2018.

(51) Int. Cl.
*C23C 14/18* (2006.01)
*C23C 14/08* (2006.01)
(Continued)

(52) U.S. Cl.
CPC .............. *G21C 3/07* (2013.01); *C23C 4/06* (2013.01); *C23C 4/11* (2016.01); *C23C 14/083* (2013.01);
(Continued)

(58) Field of Classification Search
CPC ........ G21C 3/07; G21C 3/047; C23C 14/083; C23C 14/18; C23C 14/185;
(Continued)

(56) References Cited

U.S. PATENT DOCUMENTS 3,427,222 A 2/1969 Biancheria et al.
5,075,075 A 12/1991 Kapil
(Continued)

FOREIGN PATENT DOCUMENTS

JP 2013113682 A 6/2013
JP 2014232678 A 12/2014
(Continued)

OTHER PUBLICATIONS

Van Rooyen, Pre-Irradiation Testing and Analysis to Support the LWRS Hybrid SiC-CMC-Zircaloy-4 Unfueled Rodlet Irradiation; INL—U.S. department of Energy National Laboratory operated by Battelle Energy Alliance, Sep. 2012.
(Continued)

*Primary Examiner* — Michael P Wieczorek
(74) *Attorney, Agent, or Firm* — K&L Gates LLP

(57) ABSTRACT

A method for making an improved nuclear fuel cladding tube includes reinforcing a Zr alloy tube by first winding or braiding ceramic yarn directly around the tube to form a ceramic covering, then physically bonding the ceramic covering to the tube by applying a first coating selected from the group consisting of Nb, Nb alloy, Nb oxide, Cr, Cr oxide, Cr alloy, or combinations thereof, by one of a thermal deposition process or a physical deposition process to provide structural support member for the Zr tube, and optionally applying a second coating and optionally applying a third coating by one of a thermal deposition process or a physical deposition process. If the tube softens at 800° C.-1000° C., the structural support tube will reinforce the Zr alloy tube against ballooning and bursting, thereby preventing the release of fission products to the reactor coolant.

19 Claims, 5 Drawing Sheets

(51) Int. Cl.
*C23C 4/06* (2016.01)
*C23C 4/11* (2016.01)
*C23C 24/04* (2006.01)
*D04C 1/06* (2006.01)
*G21C 3/07* (2006.01)
*G21C 3/04* (2006.01)

(52) U.S. Cl.
CPC .............. *C23C 14/18* (2013.01); *C23C 24/04* (2013.01); *D04C 1/06* (2013.01); *G21C 3/047* (2019.01)

(58) Field of Classification Search
CPC ... C23C 14/0021; C23C 14/0036; C23C 4/11; C23C 4/06; C23C 24/04
See application file for complete search history.

(56) References Cited

U.S. PATENT DOCUMENTS

| | | | |
|---|---|---|---|
| 5,182,077 A | 1/1993 | Feinroth | |
| 5,227,249 A | 7/1993 | Lukco et al. | |
| 5,338,576 A | 8/1994 | Hanzawa et al. | |
| 5,391,428 A | 2/1995 | Zender | |
| 6,246,740 B1 | 6/2001 | Maruyama et al. | |
| 7,139,360 B2 | 11/2006 | Lahoda | |
| 8,971,476 B2 | 3/2015 | Mazzoccoli et al. | |
| 9,275,762 B2* | 3/2016 | Garnier | C04B 35/571 |
| 9,336,909 B2 | 5/2016 | Mazzoccoli et al. | |
| 9,982,350 B2 | 5/2018 | Burke et al. | |
| 2006/0039524 A1 | 2/2006 | Feinroth et al. | |
| 2007/0189952 A1 | 8/2007 | Easler et al. | |
| 2009/0220040 A1 | 9/2009 | Takagi | |
| 2013/0010915 A1 | 1/2013 | Garnier et al. | |
| 2015/0063523 A1 | 3/2015 | Yacout et al. | |
| 2015/0078505 A1 | 3/2015 | Xu et al. | |
| 2017/0159186 A1* | 6/2017 | Burke | B32B 7/04 |
| 2018/0294062 A1* | 10/2018 | Wolfe | C23C 28/044 |

FOREIGN PATENT DOCUMENTS

| | | |
|---|---|---|
| JP | 2017197828 A | 11/2017 |
| WO | WO2006/076039 A2 | 7/2006 |
| WO | WO2013017621 A1 | 2/2013 |
| WO | WO2015/175035 A2 | 11/2015 |
| WO | WO2018/071066 A2 | 4/2018 |
| WO | 2020018361 A1 | 1/2020 |

OTHER PUBLICATIONS

Singh, et al., "Mechanical and Structural Properties of RF Magnetron Sputter-Deposited Silicon Carbide Films for MEMS Applications"; Journal of Micromechanics and Microengineering, vol. 22, No. 2, 2012, p. 025010, doi: 10.1088/0960-1317/22/025010.
International Searching Authority Patent Cooperation Treaty International Search Report—PCT/US2019/041546, dated Sep. 24, 2019.

* cited by examiner

SILICON CARBIDE REINFORCED ZIRCONIUM BASED CLADDING

RELATED APPLICATIONS

This application claims priority from U.S. Provisional Application Ser. No. 62/698,326 filed Jul. 16, 2018 and incorporated herein by reference.

STATEMENT REGARDING GOVERNMENT RIGHTS

This invention was made with government support under Contract No. DE-NE0008222 awarded by the Department of Energy. The U.S. Government has certain rights in this invention.

BACKGROUND OF THE INVENTION

1. Field of the Invention

The present application relates to nuclear fuel claddings, and more particularly to zirconium alloy tubes with ceramic coatings.

2. Description of the Prior Art

In a typical nuclear reactor, the reactor core includes a large number of fuel assemblies, each of which is composed of a plurality of elongated fuel rods. The fuel rods each contain nuclear fuel fissile material, usually in the form of a stack of nuclear fuel pellets surrounded by a gas, such as He or $H_2$. The fuel rods have a cladding that acts as a containment for the fissile material.

A zirconium (Zr) alloy has been used as the cladding on the fuel rods. Exemplary Zr alloys are disclosed in U.S. Pat. Nos. 3,427,222; 5,075,075; and 7,139,360, the relevant portions of which are incorporated herein by reference.

Under severe conditions such as "beyond design basis" accidents, metal cladding can react exothermally with steam at over 1093° C. These zirconium cladding metals protecting the nuclear fuel may lose strength during "a loss of coolant" accident, where reactor temperatures can reach as high as 1204° C., and expand and burst due to internal fission gases within the fuel rod.

It has been proposed that fuel rod cladding can be coated with materials to prevent exterior corrosion as disclosed in U.S. Pat. Nos. 9,336,909 and 8,971,476, the relevant portions of which are incorporated herein by reference. Coated Zr cladding overcomes one of the major issues associated with beyond design basis accidents: excessive oxidation above 1200° C. Coating with just chromium (Cr) produces a low melting eutectic between Zr and Cr at lower than the 1333° C. temperature because of the other components of the Zr alloy. To get around this issue, an initial niobium (Nb) coating has been proposed.

Even with the coatings, because it is still a metal tube, it still balloons and bursts at between 800° C. and 1100° C., releasing radioactive fission products to the reactor coolant and allowing coolant to attack the unprotected inside of the tube.

Ceramic type materials have been proposed as cladding material. Ceramic-containing coating materials, such as aluminum (III) oxide ($Al_2O_3$) and silicon carbide (SiC) have been shown to have desirable safety properties. Experimental ceramic type materials such as SiC monolith, fibers and their combinations are taught in U.S. Pat. Nos. 6,246,740; 5,391,428; 5,338,576; and 5,182,077, and U.S. Patent Application Publications 2006/0039524, 2007/0189952; and 2015/0078505, the relevant portions of which are incorporated herein by reference.

Ceramic composites have many desirable properties for use as a nuclear fuel cladding, particularly in "beyond design basis" accidents where, for example, temperatures exceed 1200° C. Use of an inner sleeve composed of a Zr alloy and an outer sleeve of ceramic fibers has been tried by first making a ceramic sleeve, such as a winding using ceramic fiber tows by braiding or by winding the fiber tows about the outer surface of a form or mandrel and then fitting the winding over the Zr alloy tube. It was found that with this approach, there are gaps formed in the spaces between the exterior of the Zr cladding tube and the ceramic sleeve and further the ceramic winding can be damaged during removal of the mandrel.

Coating the tube and then slipping it into a ceramic sleeve has been tried. However, the formation of a gap 30' between the ceramic winding 14' and the coated tube 12', as shown in FIG. 1, results in higher fuel temperatures, especially in high linear heat generation portions of the fuel rod core.

SUMMARY OF THE INVENTION

The following summary is provided to facilitate an understanding of some of the innovative features unique to the embodiments disclosed and is not intended to be a full description. A full appreciation of the various aspects of the embodiments can be gained by taking the entire specification, claims, abstract and drawings as a whole.

The method described herein provides an improved way of forming nuclear cladding tubes. In various aspects, the method of making a nuclear fuel cladding tube includes covering a zirconium alloy tube with a yarn formed from ceramic fibers by applying the yarn directly onto the tube, applying a first coating to physically bind the ceramic yarn to the tube, and applying a second coating over the first coating. The first coating in various aspects is selected from the group consisting of Nb, Nb alloy, Nb oxide, Cr, Cr alloy, Cr oxide, and combinations thereof. The first coating, in various aspects, physically binds the ceramic yarn to the Zr alloy tube, and may fill or substantially fill gaps, if any, between the fibers and between the fibers and the Zr alloy tube. Second or third optional coatings, in various aspects, may be selected from the group consisting of Cr, a Cr alloy, Cr oxide, and combinations thereof.

The tube may be covered by winding or braiding the ceramic yarn around the tube, and preferably by winding or braiding the ceramic yarn tightly around the tube such that the entire exterior surface, or substantially the entire exterior surface, of the tube is in contact with and covered by the ceramic yarn. The ceramic covering in various aspects is of a sufficient density to provide structural support for the tube at temperatures of 800° C. and above. In various aspects, the ceramic yarn is made from SiC fibers. The spacing between the SiC fibers can be from 0 to 2 mm, more preferably from 0.6 to 1.0 mm.

The first and second coatings may be applied by the same or a different process. For example, either the first or second coatings may be applied by one of a physical vapor deposition process or a thermal deposition process. If a thermal deposition process is used for either the first or the second coating application, it may be one of a cold spray or a hot spray process. If a physical vapor deposition process is used for either of the first or the second coating application, it may be one of evaporation or sputtering, such as cathodic arc vapor deposition, magnetron sputtering deposition, and pulsed laser deposition. The physical evaporation deposition process may use a cathodic arc and electron beam source.

The method described herein produces a nuclear fuel cladding tube comprised of a zirconium alloy tube, a supporting member comprised of a ceramic covering, such as a SiC covering, braided or wound directly onto the tube and bound to the tube by a first coating selected, for example, from the group consisting of Nb, Nb alloy, Nb-oxide, Cr, Cr alloy, Cr oxide, and combinations thereof. The cladding tube may optionally comprise a second coating over the first coating. A second coating may be selected from the group consisting of Cr, Cr alloys, Cr oxide, and combinations thereof. The cladding tube may optionally comprise a third coating over the second coating. A third coating also may be selected from the group consisting of Cr, Cr alloys, Cr oxide, and combinations thereof.

In certain aspects, a SiC covering layer may be between 100 and 600 microns in thickness. In certain aspects, the first coating layer may be between 1 and 20 microns in thickness. In certain aspects, the second coating layer may be between 1 and 50 microns. In certain aspects, the Zr tube wall thickness may be between 100 and 1000 microns.

Heretofore, a drawback in using Zr alloy cladding was its potential to balloon and burst at temperatures between 800° C. and 1000° C. The method described herein addresses such structural weakness by reinforcing the Zr alloy tube by first winding or braiding ceramic yarn formed for example from SiC fibers, directly around the tube thereby minimizing, and preferably significantly minimizing, and more preferably eliminating, gaps between the exterior of the tube and the interior of the fiber support. The fiber covering is then bonded to the Zr alloy tube by means of one or more cold or hot sprayed coatings or coatings applied using physical vapor deposition process or a combination of the two application methods, providing a structural support member for the Zr tube. The SiC covering will provide support to the Zr alloy tube so that when it softens at 1000° C., the tube will not balloon and burst and release fission products to the reactor coolant.

It should be understood that this disclosure is not limited to the embodiments disclosed in this Summary, and it is intended to cover modifications that are within the spirit and scope of the invention, as defined by the claims.

BRIEF DESCRIPTION OF THE DRAWINGS

The characteristics and advantages of the present disclosure may be better understood by reference to the accompanying figures.

DESCRIPTION OF THE PREFERRED EMBODIMENTS

Figure 1:
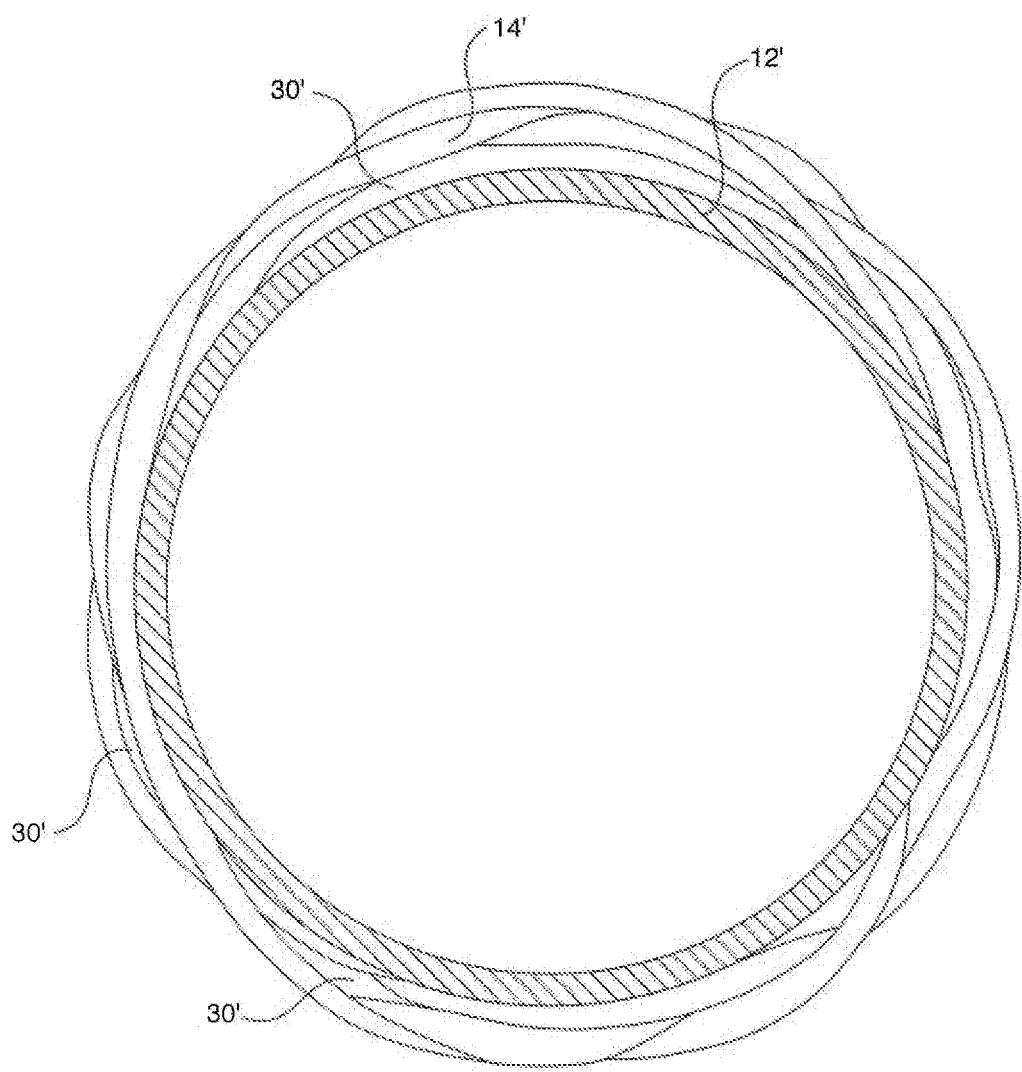
FIG. 1 is a section view of a prior art tube with a braided sleeve showing gaps between the exterior of the tube and the inner side of the fiber windings and some structural deformation of the tube.

As used herein, the singular form of "a", "an", and "the" include the plural references unless the context clearly dictates otherwise.

Directional phrases used herein, such as, for example and without limitation, top, bottom, left, right, lower, upper, front, back, and variations thereof, shall relate to the orientation of the elements shown in the accompanying drawing and are not limiting upon the claims unless otherwise expressly stated.

In the present application, including the claims, other than where otherwise indicated, all numbers expressing quantities, values or characteristics are to be understood as being modified in all instances by the term "about." Thus, numbers may be read as if preceded by the word "about" even though the term "about" may not expressly appear with the number. Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

An improved method for manufacturing a composite cladding tube 10 for a nuclear fuel rod is described herein. Referring to the Figures, a cladding tube 10 produced by the improved method is comprised of a zirconium alloy tube 12, a ceramic fiber support member 14 formed from braided or wound ceramic yarn 16 wound directly onto the exterior 20 of the tube 12. The interior side 22 of the covering 14 contacts substantially the entire exterior 20 of the tube 12, and in various aspects, covers the entire exterior surface 20 of the tube 12. A first coating 24 coats the yarn 16 and fiber covering 14 to physically bind the fiber covering 14 to the tube 12. To the extent that there are any gaps between yarns 16 or between tows of yarn or between the fiber covering 14 and the tube 12, particles 18 of the first coating 24 fills, or at least substantially fills the gaps sufficiently to provide the desired structural support for the tube 12. A second coating 26 may, in various aspects, be applied over the first coating 24. A third coating 28, in various aspects, may be applied over the second coating 26. A completed cladding tube 10 contains a stack of nuclear fuel pellets 50.

In various aspects, the method may include fabricating a Zr alloy tube 12 to a desired length and thickness. In certain aspects, the method may include forming the tube 12 with a wall thickness, for example, of about 100 and 1000 microns.

Structural support for the Zr alloy tube 12 is provided by winding or braiding yarn 16 formed from ceramic fibers over the exterior of the tube 12 to form a ceramic fiber covering 14. Braiding and winding techniques are well known to those skilled in this area of endeavor.

Figure 2:
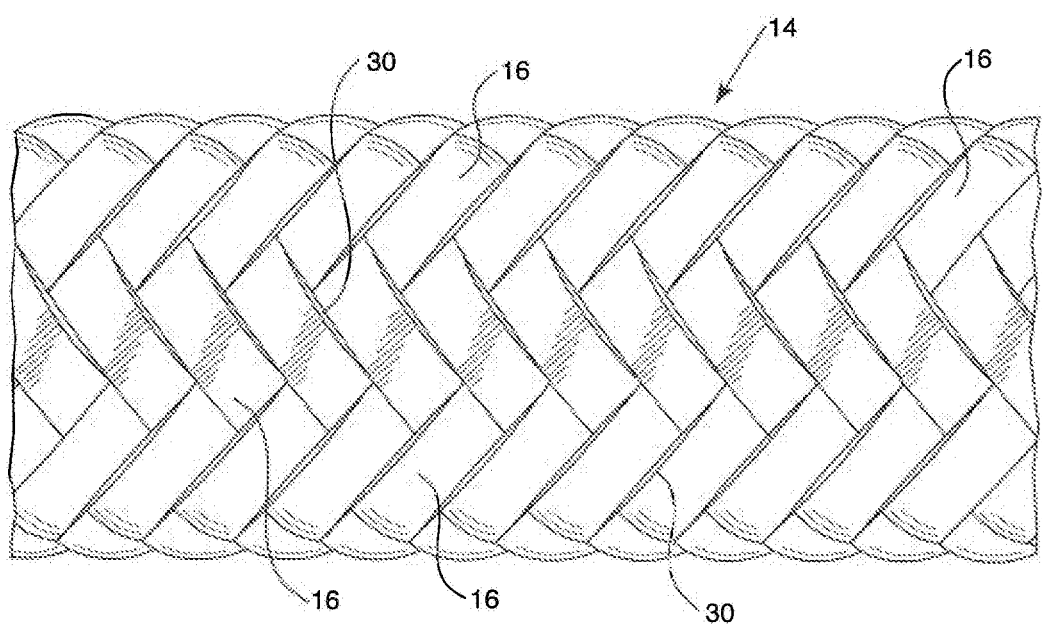
FIG. 2 shows braided fibers wound on the exterior of a tube.
Figure 3:
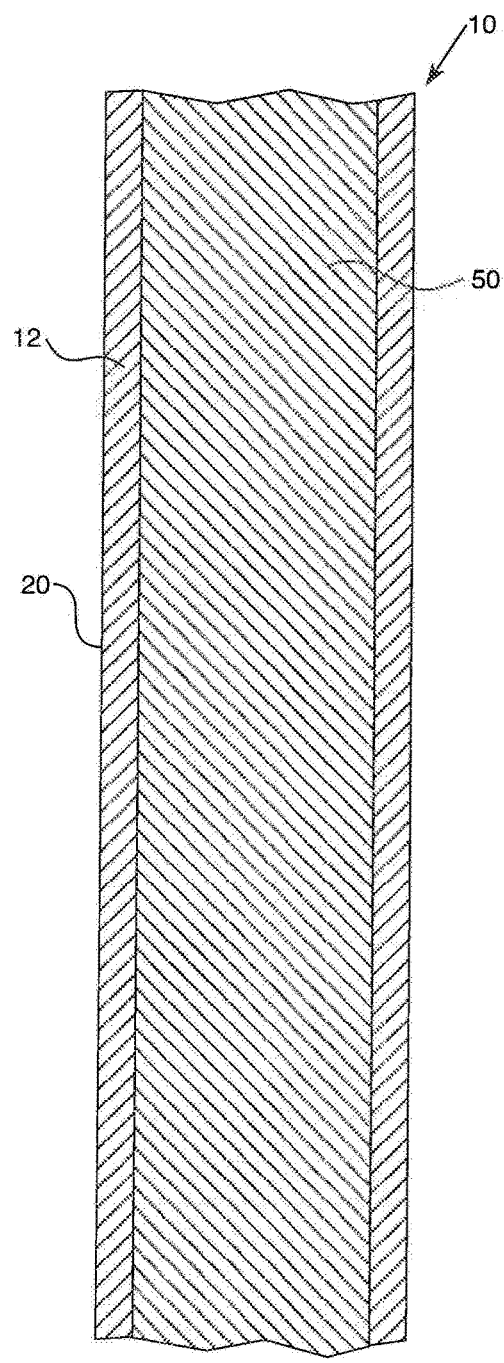
FIG. 3 is a schematic illustration of a nuclear cladding tube, such as the Zr alloy tube described herein.
Figure 4:
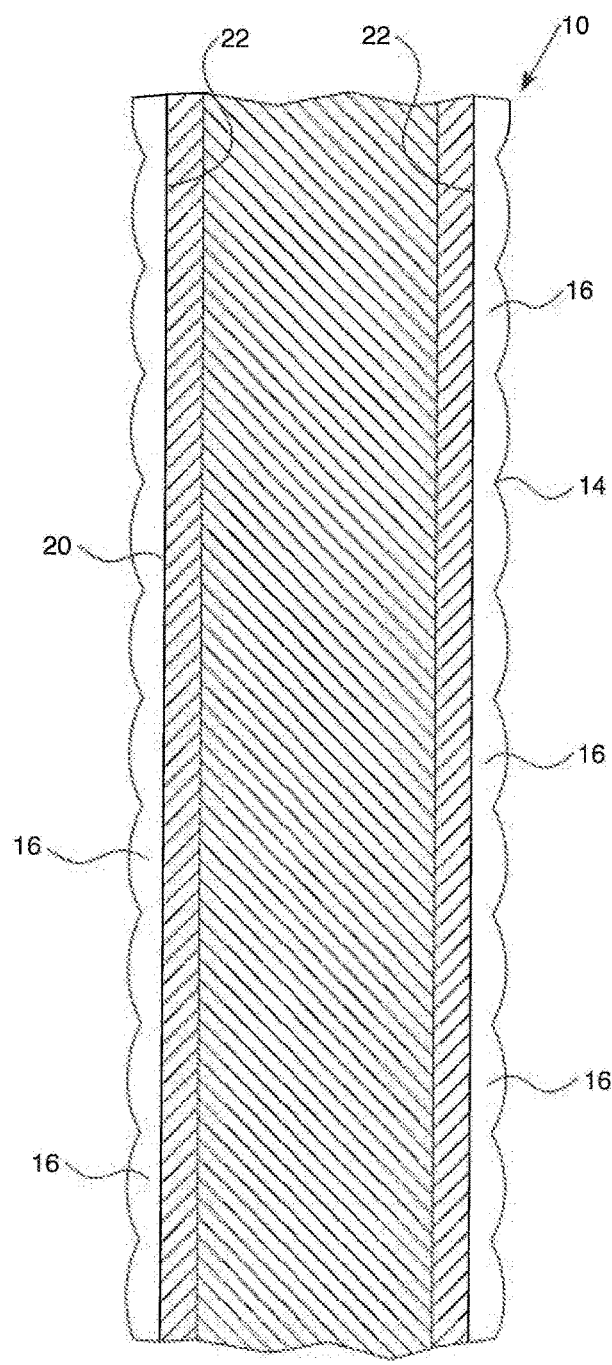
FIG. 4 is a schematic illustration of the tube of FIG. 3 showing the braided fibers wound around the exterior of the tube.
Figure 5:
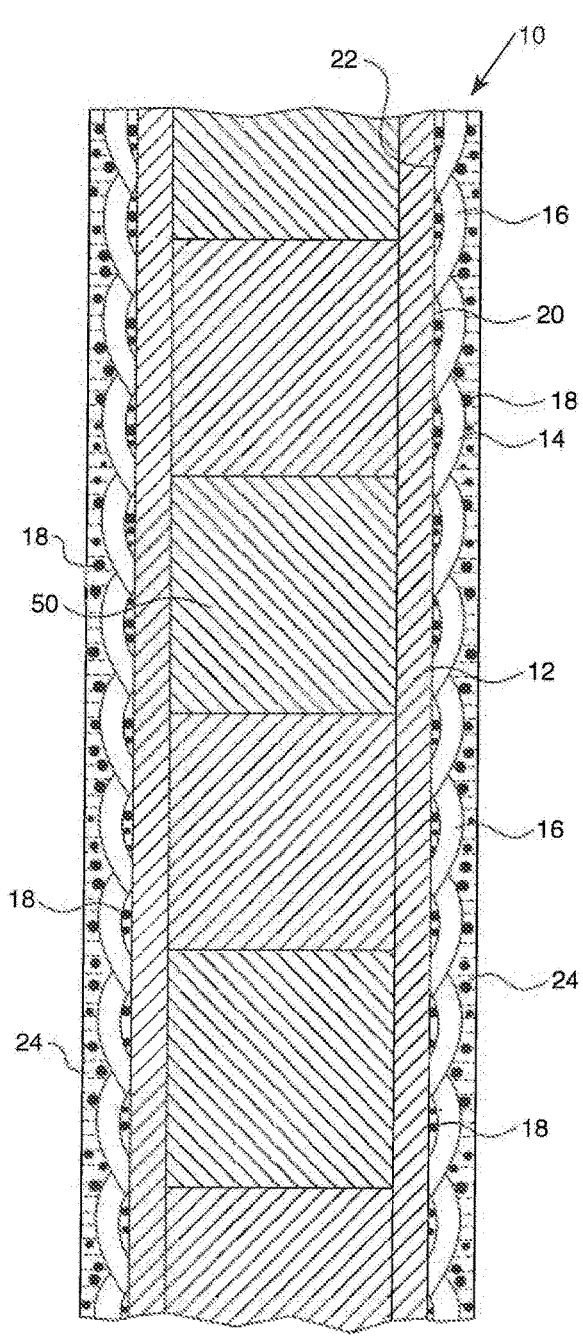
FIG. 5 is a schematic illustration of the tube and fibers of FIG. 4 with a first coating added to bind the fibers to the tube.
Figure 6:
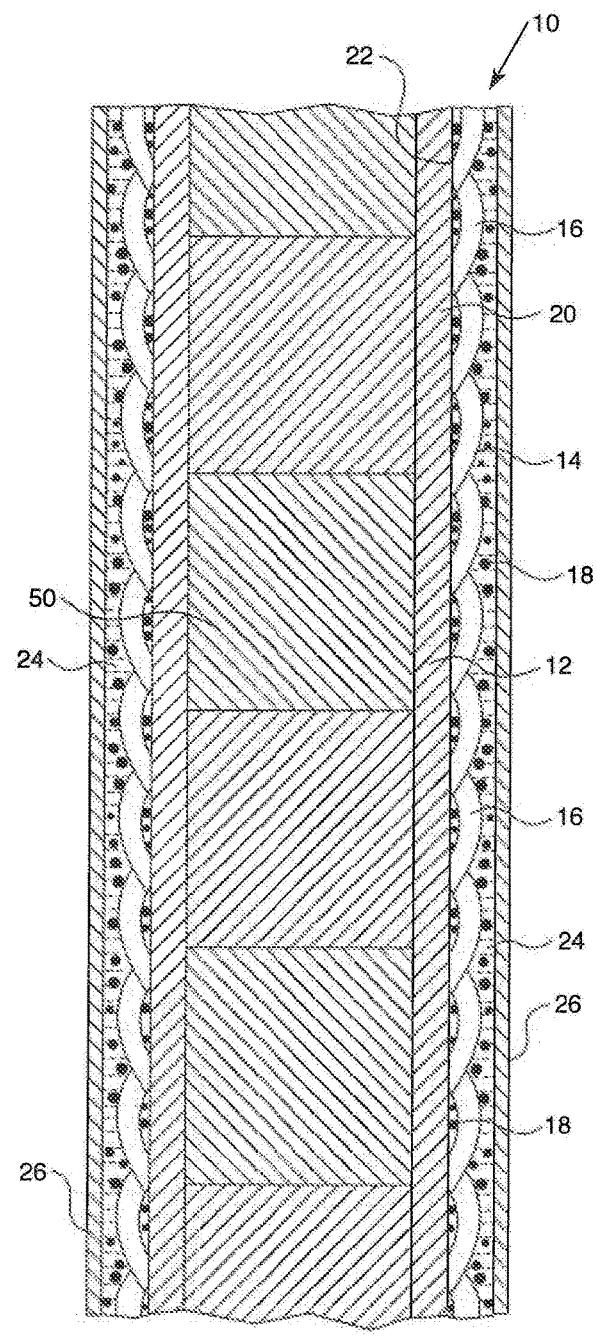
FIG. 6 is a schematic illustration of the tube of FIG. 5 with a second and third coating added thereto.
Figure 7:
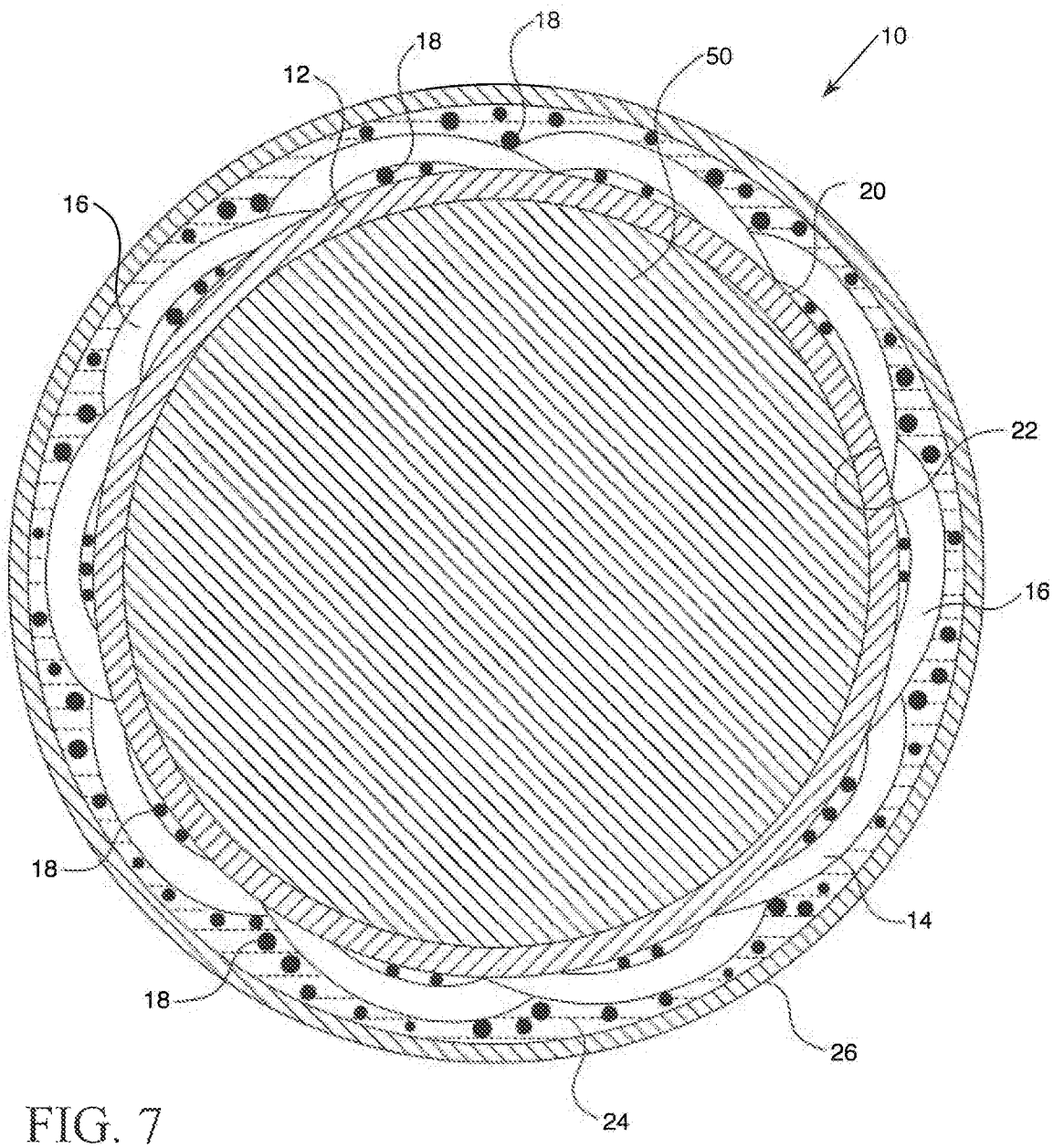
FIG. 7 is a cross-sectional view of the tube of FIG. 5 with a second coating added, showing the Zr alloy tube, the ceramic fiber wound around the tube, and the first and second coatings over the fibers. Nuclear fuel pellets are stacked in the cladding tube.

The ceramic yarn that is wound around the Zr alloy tube 12 is formed from small ceramic fibers that are wound into a tow to make the yarn. The yarn is formed into the desired geometry using conventional techniques known in the art including, for example, braiding, knitting, weaving, or winding the yarn around the tube 12. See, for example, U.S. Pat. No. 5,391,428. As shown in FIG. 2, the contours of the wrapped fiber yarn 16 may create uneven surfaces and gaps 30 between and among adjacent sections of yarn.

In various aspects, the ceramic yarn is formed from SiC fibers. The SiC fiber may preferably be a SiC fiber containing primarily Si and C, and some trace or relatively small amounts of O. Exemplary amounts may include Si: 50% to 75% (more preferably 68% to 72%) by weight
C: 25% to 60% (more preferably 28% to 32%) by weight
O: 0.01% to 14% (more preferably 0.01% to 1%) by weight.

The SiC ceramic covering would utilize SiC in the form of fiber tows with between 500 to 5000 fibers per tow. The thickness of the SiC layer would be between 100 and 600 microns. The spacing between the SiC fibers can be from 0 to 2 mm, more preferably from 0.6 to 1.0 mm.

In various aspects, referring to FIGS. 3-6, the Zr alloy tube 12 may first be wound or braided with ceramic yarns 16, formed for example from SiC fibers in a weave just dense enough to support the tube 12 and not allow ballooning at temperatures above 800° C. Physical vapor deposition or a thermal deposition process may then be used to provide a first coating physically bound to the ceramic material and to the spaces or gaps between the ceramic fibers on the Zr tube. The first coating may, in various aspects be made of a first material selected from Nb, Nb alloy, Nb oxide, Cr, Cr alloy, Cr oxide, and mixtures of any of the foregoing. A second coating may be applied over the first coating to form a top layer. The second coating is, in various aspects, made of a second material selected from Cr, Cr oxide, Cr alloy, and mixtures of any two or more thereof. The second coating layer may be applied by a physical vapor deposition or a thermal deposition process. In certain aspects, a third coating may be applied over the second coating, in which case the third coating rather than the second coating forms the top layer. The third coating may be made, in various aspects, of a third material selected from Cr, Cr oxide, Cr alloy, and mixtures of any two or more thereof. The third coating layer may be applied by a physical vapor deposition or a thermal deposition process.

The ceramic fibers, for example, SiC fibers, will provide support to the Zr alloy tube 12 so that when it softens at 800° C.-1000° C. it will not balloon and burst and release fission products to the reactor coolant. The first coating 24 both protects the ceramic covering 14 from abrasion by the second coating 26 and forms a protective layer between the Zr tube 12 and the second coating 26 to prevent formation of a low melting eutectic.

The SiC fiber is much harder (9.2 to 9.3 Mohs) than the Zr alloy (5 Mohs) and the preferred materials used to coat the tube; for example, Cr (8.5 Mohs) and Nb (6 Mohs). SiC fibers also have good thermal stability and corrosion resistance to greater than 1600° C. but begin to rapidly oxidize at approximately 1850° C. A second or third layer 26/28 of Cr which in various aspects forms a layer of $Cr_2O_3$ outer coating is both hard and very corrosion resistant to about 2200° C.

Cr and Nb, as used herein, may be pure chromium or pure niobium, respectively, which as used herein, means preferably 100% metallic chromium or niobium, respectively, which may include trace amounts of unintended impurities that do not serve any metallurgical function. For example, pure Cr may contain a few ppm of oxygen. "Cr alloy" or "Nb alloy" as used herein refer to alloys with Cr or Nb, respectively, as the dominant or majority element together with small but reasonable amounts of other elements that serve a specific function. The Cr alloy, for example, may comprise 80% to 99 atom % of chromium. Other element in the Cr alloy may include at least one chemical element selected from silicon, yttrium, aluminum, titanium, niobium, zirconium, and other transition metal elements. Such elements may be present for example at a content of 0.1 atomic % to 20 atomic %. Cr oxides as used herein may include $Cr_2O_3$ and other forms where Cr and O are the dominant elements with small or trace amounts or unintended impurities of other elements. Nb oxides as used herein may include $N_2O_5$ and other forms where Nb and O are the dominant elements with small or trace amounts or unintended impurities of other elements.

After the ceramic yarn is wound or braided onto the Zr alloy tube, the first coating is applied using, for example, a thermal deposition process, such as hot or cold spray, or advantageously, a physical vapor deposition (PVD) process, such as cathodic arc physical vapor deposition, magnetron sputtering, or pulse laser deposition (PLD). The first coating layer 24 will be deposited before the second coating layer 26 and may, in certain aspects, be ground and polished before deposition of the second coating layer 26. After the first coating layer 24 is applied, and optionally ground or polished, the second coating layer 26 is applied. The second coating layer 26, like the first may be applied by a thermal deposition process, such as hot or cold spray, or by a physical vapor deposition process, and may also be ground and polished thereafter.

A suitable thermal deposition method, in various aspects, includes either a hot spray or cold spray methods. In a hot thermal spray process, the coating feedstock material is melted by a heat source or by plasma created by a high frequency arc between an anode and a tungsten cathode (i.e. plasma arc spray). This softened liquid or molten material is then carried by process gas and would be sprayed onto the target surface, in this case, the yarn covered tube for application of the first coating, or the first coating for application of the second coating.

A cold spray method may proceed by delivering a carrier gas to a heater where the carrier gas is heated to a temperature sufficient to maintain the gas at a desired temperature, for example, from 100° C. to 1200° C., after expansion of the gas as it passes through a nozzle. In various aspects, the carrier gas may be pre-heated to a temperature between 200° C. and 1200° C., with a pressure, for example, of 5.0 MPa. In certain aspects, the carrier gas may be pre-heated to a temperature between 200° C. and 1000° C., or in certain aspects, 300° C. and 900° C. and in other aspects, between 500 C and 800° C. The temperature will depend on the Joule-Thomson cooling coefficient of the particular gas used as the carrier. Whether or not a gas cools upon expansion or compression when subjected to pressure changes depends on the value of its Joule-Thomson coefficient. For positive Joule-Thomson coefficients, the carrier gas cools and must be preheated to prevent excessive cooling which can affect the performance of the cold spray process. Those skilled in the art can determine the degree of heating using well known calculations to prevent excessive cooling. For example, for $N_2$ as a carrier gas, if the inlet temperature is 130° C., the Joule-Thomson coefficient is 0.1° C./bar. For the gas to impact the tube at 130° C. if its initial pressure is 10 bar (~146.9 psia) and the final pressure is 1 bar (~14.69 psia), then the gas needs to be preheated to about 9 bar*0.1° C./bar or about 0.9 C to about 130.9° C.

For example, the temperature for helium gas as the carrier is preferably 450° C. at a pressure of 3.0 to 4.0 MPa, and the temperature for nitrogen as the carrier may be 1100° C. at a pressure of 5.0 MPa, but may also be 600° C.-800° C. at a pressure of 3.0 to 4.0 MPa. Those skilled in the art will recognize that the temperature and pressure variables may change depending on the type of the equipment used and that equipment can be modified to adjust the temperature, pressure and volume parameters.

Suitable carrier gases are those that are inert or are not reactive, and those that particularly will not react with the particles forming the coating or the target substrate. Exemplary carrier gases include nitrogen ($N_2$), hydrogen ($H_2$), argon (Ar), carbon dioxide ($CO_2$), and helium (He).

There is considerable flexibility in regard to the selected carrier gases. Mixtures of gases may be used. Selection is driven by both physics and economics. For example, lower molecular weight gases provide higher velocities, but the highest velocities should be avoided as they could lead to a rebound of particles and therefore diminish the number of deposited particles.

The cold spray process relies on the controlled expansion of the heated carrier gas to propel the particles onto the substrate. The particles impact the substrate or a previous deposited layer and undergo plastic deformation through adiabatic shear. Subsequent particle impacts build up to form the coating. The particles may also be warmed to temperatures one-third to one-half the melting point of powder expressed in degrees Kelvin before entering the flowing carrier gas in order to promote deformation.

In an exemplary cold spray process, a high pressure gas enters through a conduit to a heater, where heating occurs quickly; substantially instantaneously. When heated to the desired temperature, the gas is directed to a gun-like instrument. Particles of the desired coating material, such as Cr, Cr alloy, Cr oxide, Nb, Nb alloy, Nb oxides, or mixtures thereof for the first coating, or Cr, Cr alloys, Cr oxides, or mixtures thereof for the second or third coating, are held in a hopper, and are released and directed to a gun where they are forced through a nozzle towards the target substrate by a pressurized gas jet. The sprayed particles are deposited onto target surface to form a coating comprised of the desired particles.

Several physical vapor deposition (PVD) processes are known in the art for depositing thin layers of materials, such as particles, to a substrate and may be used to apply one or both of the first and second coating layers. PVD may be characterized as a collective set of vacuum deposition techniques consisting of three fundamental steps: (1) vaporization of the material from a solid source assisted by high temperature vacuum or gaseous plasma; (2) transportation of the vapor in vacuum or partial vacuum to the substrate surface; and, (3) condensation onto the substrate to generate thin films.

The most common of the PVD coating processes are evaporation (typically using cathodic arc or electron beam sources), and sputtering (using magnetic enhanced sources or "magnetrons", cylindrical or hollow cathode sources). All of these processes occur in vacuum at working pressure (typically 10-2 to 10-4 mbar) and generally involve bombardment of the substrate to be coated with energetic positively charged ions during the coating process to promote high density. Additionally, reactive gases may be introduced into the vacuum chamber during metal deposition to create various compound coating compositions. The result is a very strong bond between the coating and the substrate and tailored physical and properties of the deposited layer.

Cathodic arc vapor deposition involves a source material and a substrate to be coated placed in an evacuated deposition chamber. The chamber contains only a relatively small amount of gas. The negative lead of a direct current (DC) power supply is attached to the source material (the "cathode") and the positive lead is attached to an anode. In many cases, the positive lead is attached to the deposition chamber, thereby making the chamber the anode. The electric arc is used to vaporize material from the cathode target. The vaporized material then condenses on the substrate, forming the desired layer.

Magnetron Sputtering is a plasma vapor deposition process in which a plasma is created and positively charged ions from the plasma are accelerated by an electrical field superimposed on the negatively charged electrode or "target". The positive ions are accelerated by potentials ranging from a few hundred to a few thousand electron volts and strike the negative electrode with sufficient force to dislodge and eject atoms from the target. These atoms will be ejected in a typical line-of-sight cosine distribution from the face of the target and will condense on surfaces that are placed in proximity to the magnetron sputtering cathode.

Pulsed laser deposition (PLD) is a physical vapor deposition technique where a high-power pulsed laser beam is focused inside a vacuum chamber to strike a target of the material that is to be deposited. This material is vaporized from the target (in a plasma plume) which deposits it as a thin film on a substrate. The process of PLD can generally be divided into five stages: (1) laser absorption on the target surface; (2) laser ablation of the target material and creation of a plasma; (3) dynamic of the plasma; (4) deposition of the ablation material on the substrate; and (5) nucleation and growth of the film on the substrate surface.

Following the deposition of either or both of the first and second coating layers 24, 26, the method may further include annealing the layers. Annealing modifies mechanical properties and microstructure of the coatings. Annealing involves heating the coating in the temperature range of 200° C. to 800° C., and preferably between 350° C. to 550° C. It relieves the stresses in the coating and imparts ductility to the coating which is necessary to sustain internal pressure in the cladding. As the tube bulges, the coating should also be able to bulge. Another important effect of annealing is the deformed grains formed for example during cold spray process get recrystallized to form fine sub-micron sized equiaxed grains which may be beneficial for isotropic properties and radiation damage resistance.

The coated layers may also be ground, buffed, polished, or treated by other known techniques to achieve a smoother surface finish.

The first coating layer formed from Cr, a Cr alloy, Cr oxide, Nb, Nb alloy, Nb oxide, or mixtures thereof may be between 1 and 20 microns. The second or third coating layers formed from Cr, Cr alloy, and/or Cr oxide layer and mixtures thereof may be between 1 and 50 microns. Because the Zr alloy tube is supported by the SiC support layer, its wall thickness can be between 100 and 1000 microns.

The proposed approach combines the strong points of ceramic, particularly SiC ceramic, and coated cladding to provide a low cost approach to making a corrosion resistant tube that does not balloon and burst.

By winding, for example, SiC fiber yarns 16 directly around the tube 12 to form a support covering 14, there is a significant reduction in air gaps between the tube 12 and the ceramic fiber covering 14 that is typically experienced when the fiber sleeve is formed first and then placed over the tube. It is estimated that this approach would reduce the cost of a cladding by about 25% while retaining the benefits of both Zr alloy and ceramic claddings. The lower cost is due to the elimination of the manufacturing steps for the ceramic composite except for winding which are relatively small and to the reduction in the amount of ceramic material needed as compared to an all ceramic composite tube. The material reduction is possible because the Zr alloy tube 12 provides most of the structural support and hermeticity, while the ceramic covering 14 supports the Zr tube 12 at high temperatures.

All patents, patent applications, publications, or other disclosure material mentioned herein, are hereby incorporated by reference in their entirety as if each individual reference was expressly incorporated by reference respectively. All references, and any material, or portion thereof, that are said to be incorporated by reference herein are incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative embodiments. The embodiments described herein are understood as providing illustrative features of varying detail of various embodiments of the disclosed invention; and therefore, unless otherwise specified, it is to be understood that, to the extent possible, one or more features, elements, components, constituents, ingredients, structures, modules, and/or aspects of the disclosed embodiments may be combined, separated, interchanged, and/or rearranged with or relative to one or more other features, elements, components, constituents, ingredients, structures, modules, and/or aspects of the disclosed embodiments without departing from the scope of the disclosed invention. Accordingly, it will be recognized by persons having ordinary skill in the art that various substitutions, modifications or combinations of any of the exemplary embodiments may be made without departing from the scope of the invention. In addition, persons skilled in the art will recognize, or be able to ascertain using no more than routine experimentation, many equivalents to the various embodiments of the invention described herein upon review of this specification. Thus, the invention is not limited by the description of the various embodiments, but rather by the claims.

What is claimed is:

1. A method of making a nuclear fuel cladding tube comprising:
    covering a zirconium alloy tube with ceramic fiber yarn by applying the yarn directly onto the zirconium alloy tube;
    applying a first coating to bind the ceramic fiber yarn to the tube to form an intermediate layer over the zirconium alloy tube,
        wherein the intermediate layer comprises the ceramic fiber yarn and the first coating, and wherein the first coating is made of a material selected from the group consisting of Nb, Nb alloy, Nb oxide, Cr, Cr alloy, Cr oxide, and combinations thereof; and
    applying a second coating to form a final outer layer over the intermediate layer wherein the final outer layer is made of Cr.

2. The method recited in claim 1 wherein the first coating is applied by one of a physical vapor deposition process or a thermal deposition process.

3. The method recited in claim 2 wherein the thermal deposition process is one of a cold spray or a hot spray process.

4. The method recited in claim 2 wherein the physical vapor deposition process selected from the group consisting of evaporation and sputtering.

5. The method recited in claim 2 wherein the physical vapor deposition process is selected from the group consisting of cathodic arc vapor deposition, magnetron sputtering deposition, and pulsed laser deposition.

6. The method recited in claim 1 wherein the first coating forms a layer of between 1 and 20 microns in thickness.

7. The method recited in claim 1 wherein the second coating forms a layer of between 1 and 50 microns.

8. The method recited in claim 1 wherein the second coating is applied by one of a physical vapor deposition process or a thermal deposition process.

9. The method recited in claim 8 wherein the thermal deposition process is one of a cold spray or a hot spray process.

10. The method recited in claim 8 wherein the physical vapor deposition process selected from the group consisting of evaporation and sputtering.

11. The method recited in claim 8 wherein the physical vapor deposition process is selected from the group consisting of cathodic arc vapor deposition, magnetron sputtering deposition, and pulsed laser deposition.

12. The method recited in claim 8 wherein the first and second coatings are each formed by a thermal deposition process.

13. The method recited in claim 1 wherein the ceramic fiber yarn is of a sufficient density to provide structural support for the tube at temperatures of 800° C. and above.

14. The method recited in claim 1 wherein the ceramic fiber yarn forms a layer of between 100 and 600 microns in thickness.

15. The method recited in claim 1 wherein the Zr alloy tube has a wall thickness of between 100 and 1000 microns.

16. The method recited in claim 1 wherein applying the ceramic yarn directly onto the tube comprises one of braiding or winding the yarn around the tube.

17. The method recited in claim 1 wherein the ceramic fiber yarn is made of SiC fibers.

18. A method of making a nuclear fuel cladding tube comprising:
    covering a zirconium alloy tube with SiC fiber yarn by winding the yarn directly onto the zirconium alloy tube, the covering being between 100 and 600 microns in thickness and having a density sufficient to provide structural support for the zirconium alloy tube at temperatures of 800° C. and above;
    applying a first coating to bind the SiC fiber yarn to the tube to form an intermediate layer over the zirconium alloy tube,
        wherein the intermediate layer comprises the SiC fiber yarn and the first coating, and the intermediate layer has a thickness of between 1 and 20 microns; and
        wherein the first coating is made of a first material selected from the group consisting of Nb, Nb alloy, Nb oxide, Cr, Cr alloy, Cr oxide, and combinations thereof, and the first coating is applied using a physical vapor deposition process;

applying a second coating to form a final outer layer over the intermediate layer, wherein the final outer layer has a thickness of between 1 and 50 microns, and wherein the final outer layer is made of Cr and the second coating is applied using a thermal deposition process.

19. A method of making a nuclear fuel cladding tube comprising:

covering a zirconium alloy tube with SiC fiber yarn by winding the yarn directly onto the zirconium alloy tube, the covering being between 100 and 600 microns in thickness and having a density sufficient to provide structural support for the zirconium alloy tube at temperatures of 800° C. and above;

applying a first coating to bind the SiC fiber yarn to the tube to form an intermediate layer over the zirconium alloy tube, wherein the intermediate layer comprises the SiC fiber yarn and the first coating, and the intermediate layer has a thickness of between 1 and 20 microns; and wherein the first coating is made of a first material selected from the group consisting of Nb, Nb alloy, Nb oxide, Cr, Cr alloy, Cr oxide, and combinations thereof, and the first coating is applied using a thermal deposition process;

applying a second coating to form a final outer layer over the intermediate layer, wherein the final outer layer has a thickness of between 1 and 50 microns, and wherein the final outer layer is made of Cr and the second coating is applied using a physical vapor deposition process.

* * * * *